United States Patent
Atkins et al.

[11] Patent Number: 6,131,255
[45] Date of Patent: Oct. 17, 2000

[54] REPAIRABLE WAFER SCALE INTEGRATION SYSTEM

[75] Inventors: Glen G. Atkins; Michael S. Cohen, both of Boise; Karl H. Mauritz, Eagle; James M. Shaffer, Boise, all of Id.

[73] Assignee: Micron Technology, Inc., Boise, Id.

[21] Appl. No.: 09/139,452

[22] Filed: Aug. 25, 1998

(Under 37 CFR 1.47)

Related U.S. Application Data

[63] Continuation of application No. 08/659,866, Jan. 23, 1995, Pat. No. 5,798,565, which is a continuation of application No. 08/107,436, Aug. 16, 1993, abandoned.

[51] Int. Cl.[7] .................................................. H01L 21/68
[52] U.S. Cl. .......................................................... 29/25.01
[58] Field of Search ............................... 29/25.01; 438/17

[56] References Cited

U.S. PATENT DOCUMENTS

| | | |
|---|---|---|
| 4,660,123 | 4/1987 | Hermann . |
| 4,682,270 | 7/1987 | Whitehead et al. . |
| 4,710,852 | 12/1987 | Keen . |
| 4,837,507 | 6/1989 | Hechtman . |
| 4,849,857 | 7/1989 | Butt et al. . |
| 4,937,203 | 6/1990 | Eichelberger et al. . |
| 4,968,931 | 11/1990 | Littlebury et al. . |
| 5,034,685 | 7/1991 | Leedy . |
| 5,138,434 | 8/1992 | Wood et al. . |
| 5,198,752 | 3/1993 | Mitata et al. . |
| 5,210,485 | 5/1993 | Kreiger et al. . |
| 5,223,741 | 6/1993 | Bechtel et al. . |
| 5,570,032 | 10/1996 | Atkins et al. . |
| 5,806,181 | 9/1998 | Khandros et al. . |

*Primary Examiner*—David Graybill
*Attorney, Agent, or Firm*—Trask, Britt & Rossa

[57] ABSTRACT

An apparatus for integrating wafer scale semiconductor integrated circuits and interfacing them with other systems. A wafer, partial wafer, die or plurality of same are mated to a printed circuit board (PCB) which electrically contacts the pads on each die using small conductive pillars. The PCB in turn is connected easily to other electronic systems. The entire apparatus is incorporated into other systems which utilize the dice in the apparatus. The apparatus may be fitted with heating elements and cooling channels to generate the necessary die temperatures for burn-in, testing, and operation. The apparatus is easily adaptable to include more dice in a stacked configuration.

23 Claims, 6 Drawing Sheets

REPAIRABLE WAFER SCALE INTEGRATION SYSTEM

CROSS REFERENCE TO RELATED APPLICATIONS

This application is a continuation of application Ser. No. 08/659,866, filed Jan. 23, 1995, U.S. Pat. No. 5,798,565, which is a continuation of application Ser. No. 08/107,436, filed Aug. 16, 1993, abandoned.

FIELD OF THE INVENTION

This invention relates to semiconductor electronics, and more particularly to packaging multiple integrated circuit chips for use in other systems.

Specifically, this invention provides an apparatus for repairable wafer scale integration of micro-circuits into a package easily interfaceable with other systems.

BACKGROUND OF THE INVENTION

A number of integrated circuits are typically fabricated at the same time on a common slice of silicon or wafer. This wafer is usually substantially circular with a diameter of around 3 to 6 inches (7.5 to 15 cm). Once the fabrication process is complete, the wafer is then sliced-up into the individual integrated circuit (IC) chips or dice (singular: die) which are later packaged into modules or incorporated into larger systems.

This process of dividing a wafer into its individual dice involves scribing the wafer with grooves, then breaking the wafer along those grooves like pieces of a chocolate bar. Alternatively, the dice are cut from the wafer using a saw or laser. Sometimes, the entire dividing process is referred to as "scribing". When the dice are still connected as an integral wafer or separated but closely packed together as if they still were a wafer, the IC's are said to be in the wafer scale or level of development having wafer scale equivalent density.

Typically, after scribing, IC dice are packaged individually into separate modules to be used in creating larger systems. However, to further reduce the size of the eventual system, more than one IC may be packaged in a single module called a Multi-Chip Module (MCM). As with any wafer scale system, the dice being in close proximity to each other allow for greater speed and less power consumption. However, completed MCM's are not easily repairable and require substantial design modification when different IC's are to be used.

As IC's evolved, the die size and device package pinouts were not standardized, but driven by a manufacturer's customer base and technology. Eventually, standardized IC packages and pinouts were developed. to allow interchangability among vendors. Over time, the bare dice became more robust (moisture resistance, tensil strength, etc.), allowing MCM technology to develop. But, as one vendor's dice are designed into an MCM, another vendor's dice will not fit due to different die pinouts. It is possible, however, to achieve some degree of standardization by re-routing a die's connections to a secondary set of pads elsewhere on the die. The size of these secondary pads can also vary depending on the packaging method used.

The next logical step in miniaturization for the semiconductor electronics industry involves wafer scale integration. Basically, this means closely packing the dice used in a system so that they have the same density they enjoyed when they were connected as a wafer. This reduces the size of the overall circuitry, increases speed, and lowers cost. Although technically one could produce most all of the electronics necessary in a system on a single wafer, this approach presents many problems. Defective regions on IC's which render some devices useless are quite common. This requires redundant circuitry designed into the chip, which in turn takes up more space. More desirable would be a way of replacing those defective portions of the wafer while still maintaining circuit density.

Due to their junction temperatures, IC's are the most statistically significant determinate of reliability in most electronic systems, and a major factor in overall product reliability. Maintaining a high thermal conduction path for IC's is important. Heat build up is prevented where the junction temperature is the same for each die as occurs with wafer scale densities, allowing higher reliability along with a more integrated package. Additionally, some IC's benefit from or are required to operate in a cooled environment.

Most IC's that are going to fail before a reasonable lifetime do so at an early stage. Therefore, these units may be screened out by running all the IC's for a time and then testing prior to shipment. This weeding out process can be hastened by elevating the temperature and applying voltages either statically or dynamically to the IC's. This process is called burn-in. In the past, this required the placing the packaged IC module into a special oven or autoclave capable of applying the proper burn-in voltages or signals.

Wafer scale testing of IC's involves using a test probe. In a time-consuming procedure, the probe must be precisely aligned with each die to be tested, one at a time.

Currently, in the industry there is no known device which accomplishes easily repairable wafer scale integration.

SUMMARY OF THE INVENTION

The principal and secondary objects of this invention are to provide a vessel which allows integrating a plurality of integrated circuit (IC) chips existing as dice, partial wafers or entire wafers together with wafer scale equivalent density into an apparatus which provides electronic connection between the IC's and other systems.

These and other objects are achieved by creating a vessel which allows attachment of a printed circuit board (PCB) or boards to the tops of the wafers, partial wafers or dice. The PCB serves as an interface between the IC's and outboard equipment. The PCB has a plurality of electrically conductive pillars or bumps protruding from its surface closest to the dice. These pillars are arranged so that tips of the pillars precisely contact the pads of the circuits on the dice when the PCB and dice are brought and held together in alignment.

For the sake of conciseness, this specification will refer to IC chips as they exist as singulated dice. However, any combination of dice, partial wafers, or entire wafers may be integrated with the invention.

Maintaining the PCB/dice connection requires holding the dice in a precise, non-permanent orientation with respect to the PCB and applying the proper force, uniformly distributed across both the PCB and the dice. This is accomplished by mounting the dice onto the surface of a plate using an adhesive or other means. The PCB is mounted beneath a second plate situated above the first plate. These two plates are brought precisely together using alignment and support means, thereby mating the PCB to the dice and providing adequate connection of pillars to pads.

The plates and thus PCB and dice are easily separable, allowing speedy replacement of the dice. The adhesive used is strong enough to provide adequate stability to the attached dice, but weak enough to allow easy removal of the dice by vacuum pick-up or other means. The plates are made of material which allows them to act as heat sinks.

The vessel may also act as a test and burn-in platform for those dice which require it. To facilitate burn-in, the vessel may be placed entirely in an oven or a heating element may be built into the vessel. Circuits requiring special cooling can be accommodated by including cooling channels within the vessel, through which gaseous or liquid cooling fluid can be pumped. Since the dice are all hooked up simultaneously, many of these functions can be done in parallel and with the dice interconnected and acting in concert.

The PCB can have passive or active components including capacitors, resistors, and IC's mounted on areas unused by the pillars, thereby transforming the PCB into more than just an interconnect medium.

Electronics may be devised that allow individual dice to be powered up. Unpowered devices whose pads, whether input or output type, are bussed to powered devices will have negligible loads, allowing easy implementation of ECC or electronic sparring.

A dice map may be maintained in software within the PCB or outboard electronics which records the status, performance characteristics, and location of all the dice in the vessel.

Other vessel designs are possible which include multiple stacking of a plurality of plates, PCB's, and sets of dice.

DESCRIPTION OF THE PREFERRED EMBODIMENTS OF THE INVENTION

Figure 1:
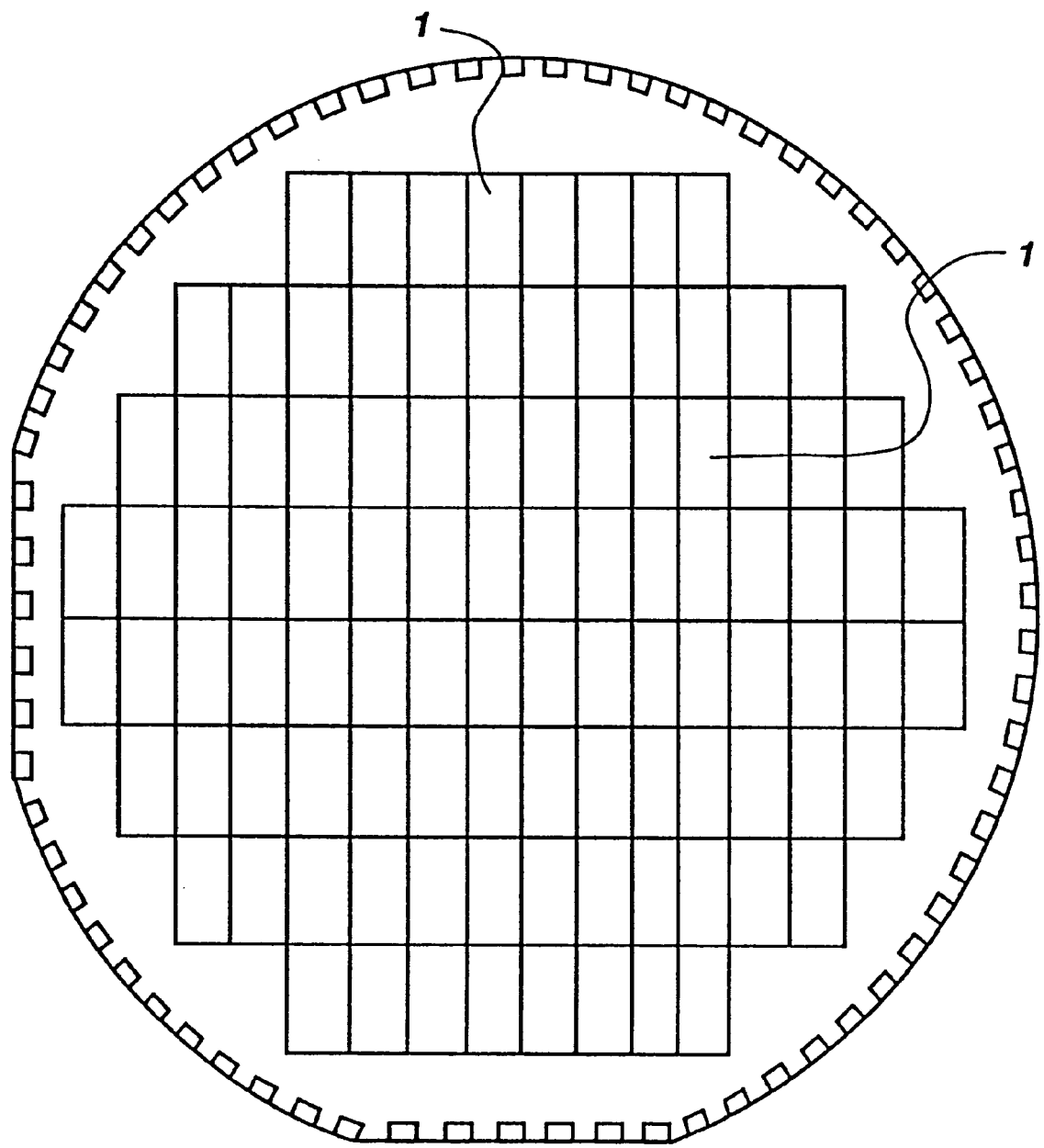
FIG. 1 is a plan view of a typical wafer.
Figure 2:
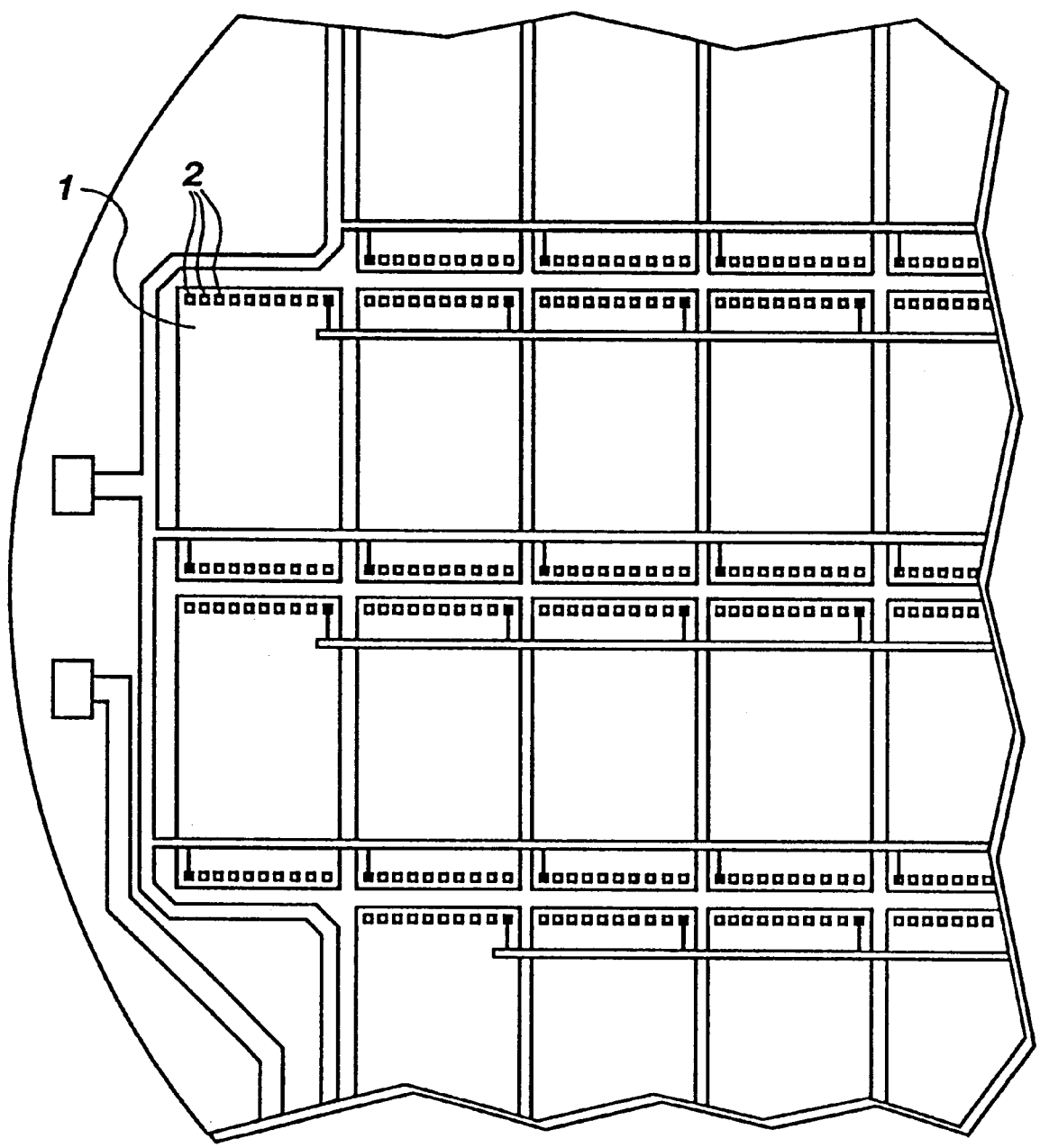
FIG. 2 is a zoomed-in plan view of a typical wafer.

Referring now to the drawing, FIG. 1 shows a typical circular semiconductor wafer after fabrication. The wafer comprises many closely packed integrated circuit chips or dice 1 which will eventually be separated from one another. FIG. 2 shows a blown-up portion of the wafer. Each individual die 1 has a number of contact pads 2 which are the electrical connection points for the circuit on that die. The wafer may then be singulated. by scribing out dice or groups of dice (partial wafers).

Figure 3:
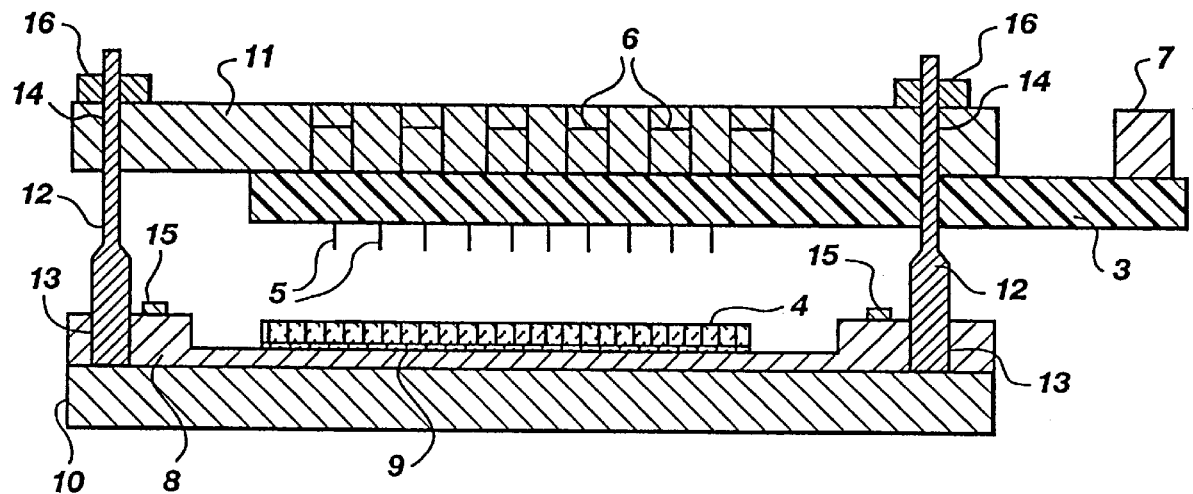
FIG. 3 is a cross sectional view of the vessel.

The dice, partial wafers, or entire wafers are loaded into a vessel, the cross-section of which is seen in FIG. 3. In general, the vessel serves to bring a printed circuit board (PCB) 3 into precise electrical contact. with the pads on the dice 4. Direct contact is made from PCB to wafer through a plurality of conductive pillars or bumps 5, one pillar per pad.

Therefore, each die is independently routed via the pillars and traces of the PCB to connectors 6 and/or 7 which electronically connect the PCB and, hence, the dice to other components of a system or to test equipment.

The optimum arrangement of the pillars and likewise the pads of a given die type may become an industry standard. Should some other standard be agreed upon, pillar arrangement can be modified to conform to that pad arrangement. It is anticipated that the pillars will be small and precise enough so that a PCB can be built having an overabundance of pillars arranged to engage a number of different standard pad arrangements. The excess pillars which do not contact any pads on a particular die can be deselected in software.

To secure their position, the dice 4 are attached to the wafer saw carrier frame (carrier) 8 using an adhesive layer 9. The carrier is then mounted to the upper side of a lower plate 10 which provides sturdy, rigid support for the carrier and acts as a heat sink, drawing heat away from the dice during operation.

The PCB is attached to the underside of an upper pressure plate heat sink (plate) 11. The upper plate provides sturdy, rigid support for the PCB while acting as a heat sink as well. When the two plates are brought together, they provide a uniform compressing force across both the PCB and dice, thereby maintaining proper contact between them.

The position of the plates in relation to each other is maintained by the alignment guides 12 which are firmly attached to or integral with the lower plate. The alignment guides restrict lateral movement of the carrier by engaging holes 13 through the carrier. They also laterally align the upper plate to the lower plate by slidingly engaging holes 14 in the upper plate and, if necessary, in the PCB.

Vertical movement of the upper plate in the downward direction is restricted by spacers 15 attached to the lower plate that rest up against the exposed underside of the upper plate when the PCB and wafer are in proper contact with each other. Vertical movement in the upward direction is restricted by fasteners 16 attached to the alignment guides above the upper plate.

The resulting vessel is field repairable. At any time, the vessel can be disconnected from a system and the plates separated. Offending dice may then be replaced, the plates brought back together, and the vessel reinstalled Some of the features of the vessel require more detailed description. The adhesive layer 9 can be formed from sticky tape or epoxy to provide for more stable attachment of the dice. Alternative attachment means, either mechanical or adhesive, can be employed, however, the attachment needs to remain intact and functional at temperatures in excess of 125 degrees C. and in cold temperatures around −55 degrees C. Also, adhesion should not be so strong as to cause difficulty in later removing the dice by vacuum pickup.

The dice are aligned with the carrier optically or with the use of tooling holes and placed by robot or other means. The targeting features already existing on the carrier for use in scribing may be used to optically align the dice laterally and rotationally for mating with the PCB. The PCB itself contains a targeting feature or fiducial to precisely align it to the upper plate. Components of the vessel are constructed to such a tolerance that the carrier is already aligned with respect to the vessel.

Figure 4:
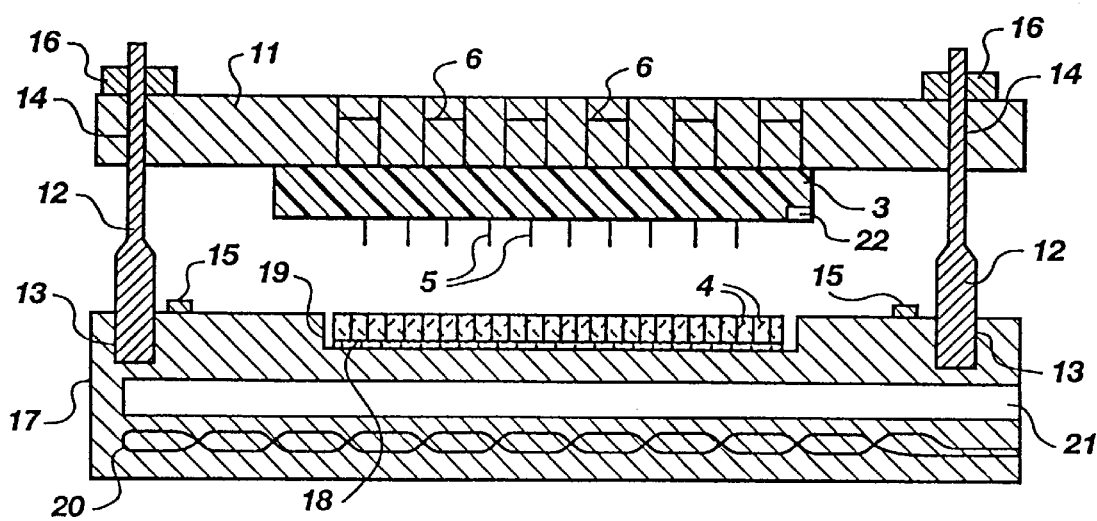
FIG. 4 is a cross sectional view of an alternate form of the vessel with heating and cooling means added.

The invention is by no means restricted to using the carrier as a platform for the dice. FIG. 4 shows the dice 4 placed directly on an upper surface of the lower plate 17 which has been coated with an adhesive layer 18. Here, the upper surface of the plate has a recess 19 sized and dimensioned to hold the dice and allow for their thermal expansion. This recess may also serve to mechanically align the dice within the vessel.

FIG. 4 also shows a heating element 20 incorporated within the lower plate, thereby making the vessel a stand-alone miniature burn-in oven or autoclave. Cooling means may be realized by boring channels 21 in the lower plate through which gaseous or liquid cooling fluid can pass. External methods of heating and cooling may be used in lieu of, or in addition to, these features. A thermal sensor 22 is incorporated into the vessel (in this case on the PCB) to monitor the dice temperature.

The PCB can be constructed of polyimide, KEVLAR brand material, KAPTON brand material, or any similar material capable of withstanding hot and cold environments. The PCB may be constructed with multiple power and ground layers, depending on the application.

The vessel design should allow for removable/replaceable PCB boards. Depending on the application, type of dice used or the system in which the vessel is used, different PCB's can be loaded into the vessel. For example, one PCB with reduced connections and controlling logic (microprocessors, multiplexers, etc.) might be used for testing. A PCB with no logic and several connectors might be used for burn-in. Different PCB's may have different onboard electronics, depending on the application.

Figure 5:
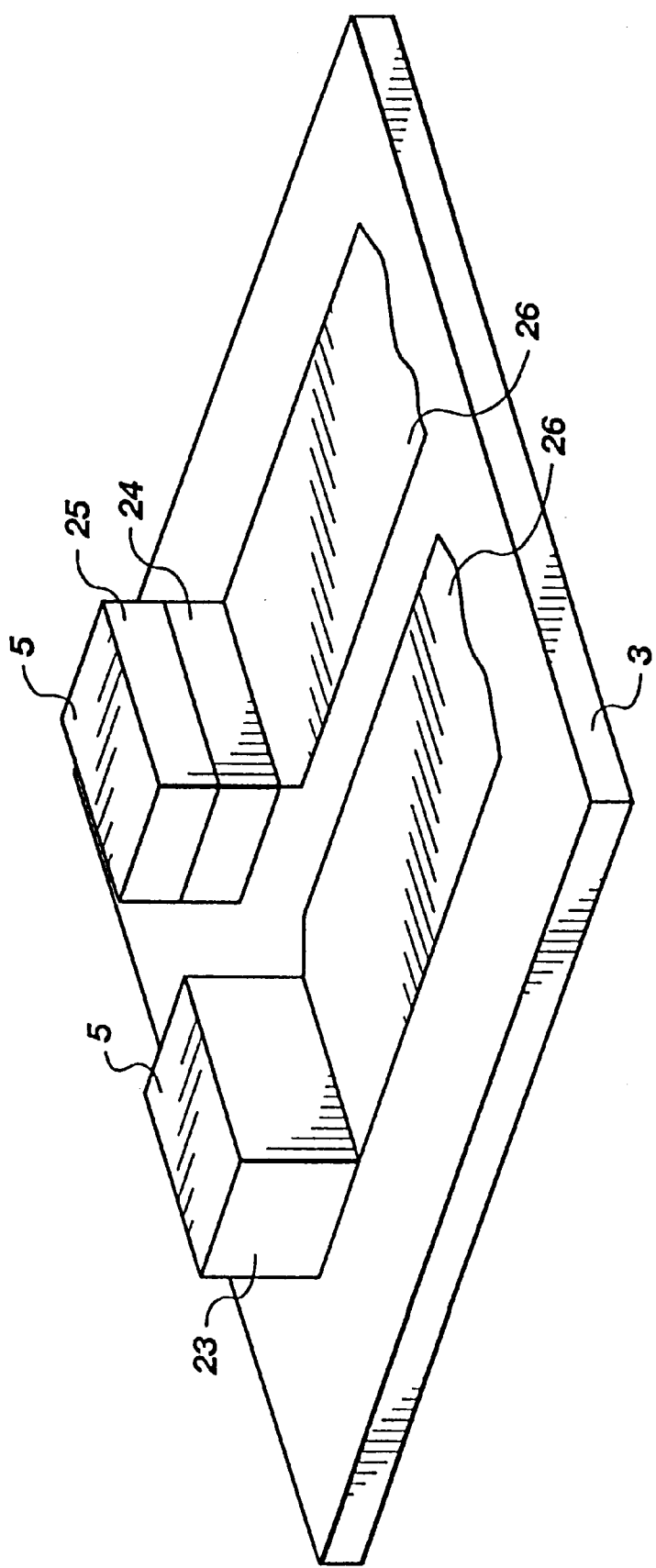
FIG. 5 is an inverted perspective view of a section the of underside of the printed circuit board with pillars extending upward.

FIG. 5 shows the PCB 3 in an inverted orientation with the conductive pillars 5 extending upward. The conductive pillars need to be pliable to avoid strain build-up over temperature increases. They can be made of different materials such as conductive, pliable epoxies and silicones, or conductive polymer/epoxy as depicted by the first pillar 23 or a combination of metal bumping such as solder 24 and conductive polymer/epoxy 25. Also shown are conductive connection lines or traces 26 which are part of the PCB.

Since the pads on the dice lie substantially within a horizontal plane, the ends of the pillars must be substantially planar to properly engage them. This can be achieved by freezing the pillars to a certain level of rigidity, then milling them down, or by melting the ends off using a mold of the proper height and tolerance. Alternatively, the pillars may be impregnated with laser sensitive materials, allowing laser machining. The pillar height may have to be adjusted to allow for thermal expansion of the PCB and dice. Furthermore, additional metal shavings may be placed in the pillar material, creating a wiping surface to remove metal oxides on the die pads when the PCB and dice are mated.

The openness of the vessel design subjects bare dice to moisture in the air. Therefore, steps must be taken to make the dice somewhat robust. Usually, the aluminum pads are the weakest link on the die. One solution involves placing barrier metal such as nickel and tungsten over the pads, making them moisture resistant and as tough as packaged devices. Obviously, allowing electrical connection to the pads is the major concern.

The pillars may be constructed by screening on and gold plating. In this case, epoxy or silicon may be screened onto only a portion of a metal land pattern upon which the pillar is formed and which electrically connects the pillar to the rest of the PCB. Electroplating would then cover the pillar and adjacent metal land pattern, providing a conductive path from the tip of the pillar to the metal land pattern. The plating may be very thin, up to 10 microinches. This allows the pads on the dice to be deformed under pressure without breaking the plating.

Figure 6:
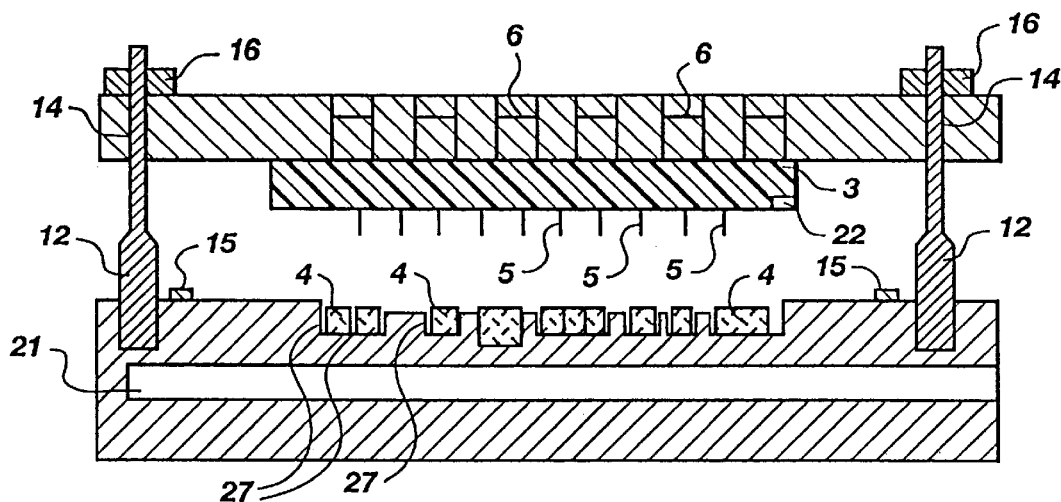
FIG. 6 is a cross sectional view of the vessel with varying depth recesses for accommodating dice of different thicknesses.

As seen in FIG. 6, the lower plate may have a plurality of recesses 27 with different depths in order to accommodate dice of varying thicknesses such that the tops of the dice have the proper height for contact with the pillars. Alternatively, the pillars may be of varying heights. The pillars may also have some conductive glue or metal shavings on the end to form a more durable connection to the contact pads on the dice if the vessel is to be used within a highly vibrational environment. However, utilizing glue will most likely increase the difficulty in rapidly replacing defective dice.

Figure 7:
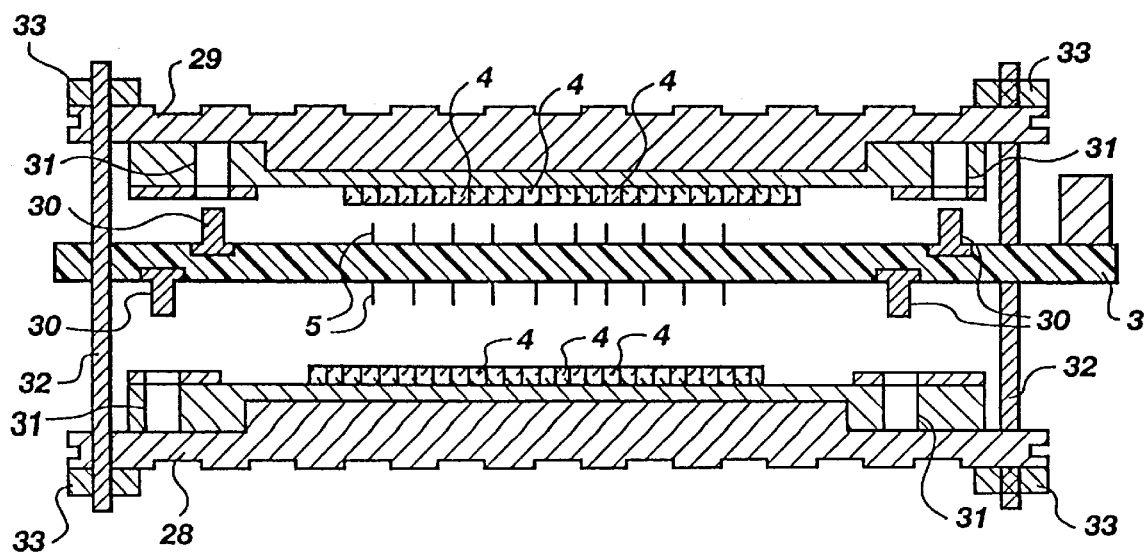
FIG. 7 is a cross sectional view of a vessel with a PCB having upper and lower sets of pillars for engaging dice attached to both the upper and lower plates.

FIG. 7 shows the invention is not restricted to a single mating configuration. Here, the PCB 3 itself is formed into a plate with pillars 5 extending from both the top and bottom. The PCB is sandwiched between two plates 28 and 29 supporting carriers which have dice attached. Note the alignment buttons 30 and corresponding tunnels 31 as alternative means for aligning the plates. The buttons are made of a deformable plastic which allows them to deform under stress then bounce back when the stress is removed, thereby facilitating a more stable fit. The buttons allow the alignment guides 32 to be made with a lower degree of tolerance. The guides themselves may be made to allow for fasteners 33 at both ends.

Figure 8:
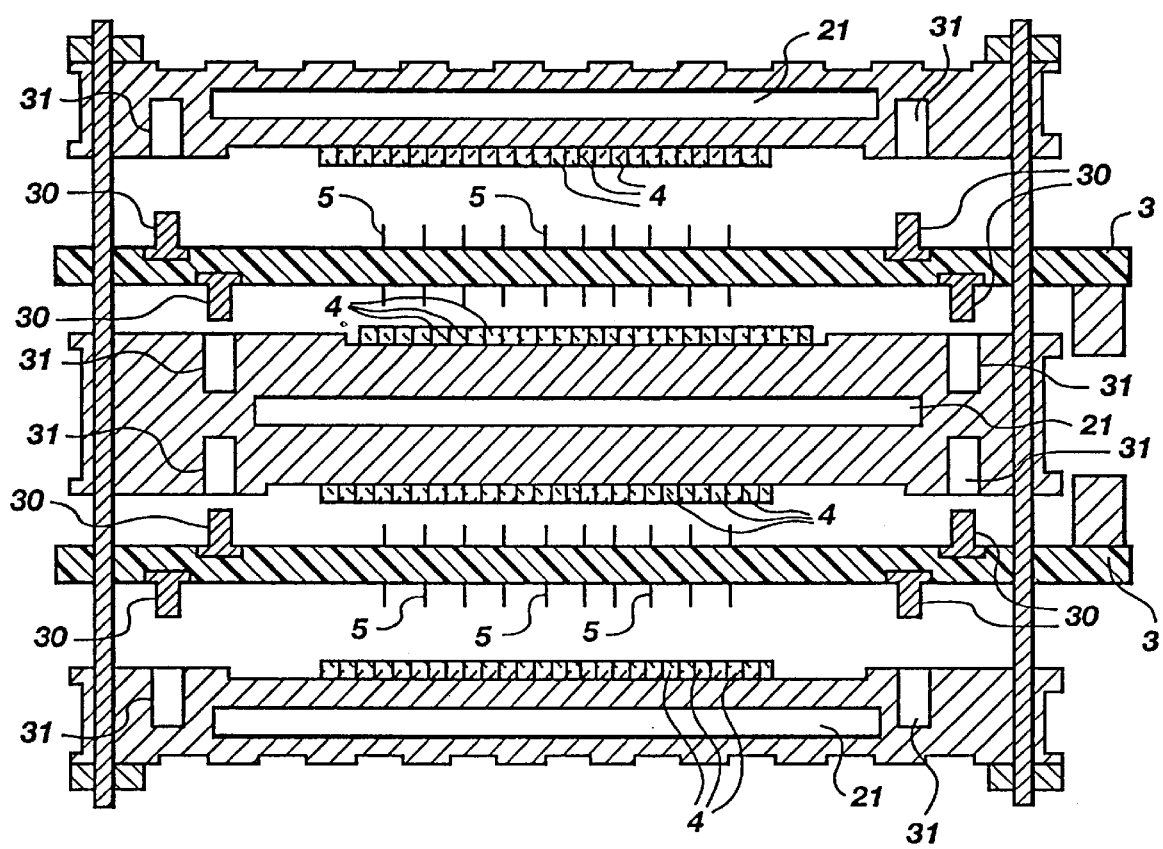
FIG. 8 is a cross sectional view of a vessel using a multi-plate, multi-PCB stacked configuration.

FIG. 8 shows the use of multiple stacked plates and PCB's to increase integration. Clearly, the stacked configuration can include plates which are built to accept a carrier, plates to which dice can be directly attached, and plates with cooling channels or heating elements built in.

Upon discovery of defective circuitry within the dice of a vessel, the vessel may be opened to allow for replacement or repair of the defective die. A dice map is maintained in software onboard the PCB(s) or in the outboard system which maintains a record for each die. This may be utilized in locating the offending die and determining the corrective procedures to be used.

Electronic mapping of the dice allows the circuitry present to be grouped into bytes, words, etc. This grouping allows the system to be self-monitoring and repairing. Software can automatically account for some circuitry that goes bad and map around it using sparring or other error correction schemes. Alternatively, software can flag the user to those dice which need replacement.

This integration concept works for any technology mix of analog devices, microprocessors, volatile and non-volatile memory devices, multiplexors, and other digital or analog logic regardless of the technology, e.g. CMOS, ECL, etc.

The vessel design is disclosed in a very generic manner. Depending on the type of equipment housing the vessel, the vessel's design can be altered radically without departing from the spirit of the invention.

While the preferred embodiments of the invention have been described, modifications can be made and other embodiments may be devised without departing from the spirit of the invention and the scope of the appended claims.

What is claimed is:

1. A vessel for interfacing a plurality of semiconductor integrated circuit dice, each of said dice having a plurality of contact pads, with other electronic systems, said vessel comprising:

at least one printed circuit board (PCB);

means for non-permanently maintaining a precise position of said PCB with respect to said dice; and means for non-permanently electrically connecting said PCB to said contact pads, said means for non-permanently electrically connecting comprises:

a plurality of electrically conductive pillars extending from said PCB;

said pillars positioned to precisely contact said contact pads when said dice and PCB are brought together in alignment;

wherein said means for non-permanently maintaining said precise position comprise:

an upper plate;

means for attaching said PCB to said upper plate;

said upper plate sized and positioned to impart a substantially uniform vertical force across said PCB and thereby said pillars;

a lower plate;

means for non-permanently attaching said dice to said lower plate;

said lower plate sized and positioned to impart a substantially uniform vertical force across said dice; and means for rigidly and non-permanently maintaining a position of the upper plate with respect to the lower plate;

wherein said means for non-permanently attaching said dice to said lower plate comprise:

said lower plate having a plurality of recesses sized and dimensioned to accommodate dice of varying thicknesses such that tops of said dice lie substantially within a plane.

2. The vessel of claim 1 wherein said means for attaching said PCB to said upper plate comprise:

means for quickly detaching said PCB from said upper plate thereby allowing for replacement of said PCB, depending on type of wafer and type of testing to be performed.

3. The vessel of claim 1 which further comprises:

electronic means for generating signals and power necessary to test said dice.

4. The vessel of claim 1 wherein said means for non-permanently maintaining said precise position of said PCB with respect to said dice comprises:

a fiducial or optical targeting feature.

5. The vessel of claim 1 wherein said means for non-permanently maintaining said precise position of said PCB with respect to said dice further comprises:

said lower plate having at least one tooling hole bored into an upper surface thereof, said hole being sized and dimensioned to precisely receive said dice.

6. The vessel of claim 1 which further comprises:

means for heating said dice.

7. The vessel of claim 6 which further comprises:

means for cooling said dice.

8. The vessel of claim 7 wherein said means for heating said dice comprises:

a heating element integral with said lower plate.

9. The vessel of claim 8 wherein said means for cooling said dice comprises:

said lower plate having a channel bored there through, said channel being sized and dimensioned to accommodate gaseous or liquid coolant being circulated through said channel.

10. The vessel of claim 9 which further comprises a thermal sensor for monitoring atemperature of said dice.

11. A vessel for interfacing a plurality of semiconductor integrated circuit dice, each of said dice having a plurality of contact pads with other electronic systems, said vessel comprises:

at least one printed circuit board (PCB);

means for non-permanently maintaining a precise position of said PCB with respect to said dice; and means for non-permanently electrically connecting said PCB to said contact pads;

said means for non-permanently electrically connecting comprises:

a plurality of electrically conductive pillars extending from said PCB;

said pillars positioned to precisely contact said contact pads when said dice and PCB are brought together in alignment;

wherein each of said pillars comprises:

a metal land pattern;

an epoxy portion; and a metal plated portion.

12. The vessel of claim 11 wherein said pillars comprise laser sensitive materials, thereby allowing the pillars to be laser machined.

13. The vessel of claim 11 wherein each of said pillars further comprises metal, shavings, thereby allowing said pillars to remove metal oxides from said contact pads during contact.

14. The vessel of claim 11 which further comprises:

an amount of glue applied between an end of each of a number of said pillars and each of a number of said contact pads.

15. The vessel of claim 11 wherein:

said pillars are of differing heights to accommodate dice of varying thicknesses.

16. A vessel for interfacing a plurality of semiconductor integrated circuit dice, each of said dice having a plurality of contact pads, with other electronic systems, said vessel comprises:

a first printed circuit board (PCB);

means for non-permanently maintaining a precise position of said first PCB with respect to said dice; and means for non-permanently electrically connecting said first PCB to said contact pads;

said means for non-permanently electrically connecting comprises:

a plurality of electrically conductive pillars extending from said first PCB;

said pillars positioned to precisely contact said pads when said dice and said first PCB are brought together in alignment;

wherein said first PCB is formed into a rigid plate; and said pillars extend from both a top surface of said first PCB and a bottom surface of said first PCB.

17. The vessel of claim 16 wherein:

a plurality of PCB's engage dice attached to a plurality of plates in a stacked configuration.

18. The vessel of claim 11, wherein said metal plated portion is not thicker than 10 (ten) microinches.

19. The vessel of claim 1 wherein said means for non-permanently attaching said dice to said lower plate comprises:

an adhesive layer between said dice and said lower plate.

20. The vessel of claim 19 wherein said adhesive layer comprises:

sticky tape or epoxy having a consistency of sticky tape.

21. The vessel of claim 1 wherein said means for non-permanently attaching said dice to said lower plate comprises:

a wafer saw carrier frame (carrier);

means for aligning said carrier with said lower plate; and means for affixing said carrier to said lower plate.

22. The vessel of claim 1 wherein said recesses are further sized and dimensioned to allow for thermal expansion of said dice and said vessel.

23. The vessel of claim 16 which further comprises:

an upper plate;

means for non-permanently attaching a first number of said dice to a lower surface of said upper plate;

a lower plate;

means for non-permanently attaching a second number of said dice to an upper surface of said lower plate;

wherein a first number of said pillars extending from said top surface of said first PCB detachably contact said first number of said dice, and a second number of said pillars extending from said bottom surface of said first PCB detachably contact said second number of said dice.

* * * * *

UNITED STATES PATENT AND TRADEMARK OFFICE
CERTIFICATE OF CORRECTION

| | |
|---|---|
| PATENT NO. | : 6,131,255 |
| APPLICATION NO. | : 09/139452 |
| DATED | : October 17, 2000 |
| INVENTOR(S) | : Glen G. Atkins et al. |

It is certified that error appears in the above-identified patent and that said Letters Patent is hereby corrected as shown below:

COLUMN 1, LINE 52, change "developed. to allow" to --developed to allow--

COLUMN 6, LINE 4, change "for. contact" to --for contact--

In the claims:
CLAIM 10, COLUMN 7, LINE 67, change "atemperature" to --a temperature--
CLAIM 13, COLUMN 8, LINE 27, change "metal, shavings," to --metal shavings,--

Signed and Sealed this

Fourth Day of September, 2007

JON W. DUDAS
*Director of the United States Patent and Trademark Office*